United States Patent
Inui et al.

(10) Patent No.: US 8,021,441 B2
(45) Date of Patent: Sep. 20, 2011

(54) METHOD OF VAPORIZING SOLID ORGANOMETALLIC COMPOUND

(75) Inventors: Katsumi Inui, Niihama (JP); Naoyuki Ide, Niihama (JP); Motoki Takahashi, Saijo (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 913 days.

(21) Appl. No.: 11/877,040

(22) Filed: Oct. 23, 2007

(65) Prior Publication Data

US 2008/0102018 A1    May 1, 2008

(30) Foreign Application Priority Data

Oct. 30, 2006 (JP) ................... 2006-293711

(51) Int. Cl.
*B01D 9/00* (2006.01)

(52) U.S. Cl. ......................................... 23/295 R; 23/296
(58) Field of Classification Search ................ 23/295 R, 23/296, 294 R
See application file for complete search history.

(56) References Cited

U.S. PATENT DOCUMENTS

| 5,989,305 A | 11/1999 | Ohsaki et al. |
| 2006/0102079 A1 | 5/2006 | Glassman et al. |

FOREIGN PATENT DOCUMENTS

| JP | 1-265511 A | 10/1989 |
| JP | 8-250440 A | 9/1996 |
| JP | 8-299778 A | 11/1996 |

*Primary Examiner* — Edward Johnson
(74) *Attorney, Agent, or Firm* — Sughrue Mion, PLLC

(57) ABSTRACT

A method of vaporizing a solid organometallic compound in which the method comprises filling the solid organometallic compound into a container, introducing a carrier gas to the container and taking out the gas containing the organometallic compound, wherein the solid organometallic compound is in the form of pellets and contains an inert support.

3 Claims, 1 Drawing Sheet

METHOD OF VAPORIZING SOLID ORGANOMETALLIC COMPOUND

BACKGROUND OF THE INVENTION

1. Field of the Invention

The present invention relates to a method of vaporizing from container an organometallic compound which is solid at normal temperature. Specifically, the invention relates to a method of vaporizing a solid organometallic compound in a container wherein the solid organometallic compound is vaporized at a constant concentration and the remaining amount of the solid organometallic compound in the container is effectively reduced.

2. Description of the Related Art

An organometallic compound such as trimethylindium is useful, for example, as a raw material for a compound semiconductor. Generally, a container filled with an organometallic compound is disposed in a temperature-controlled bath at predetermined temperature, a carrier gas such as hydrogen is introduced into the container so as to contact with the organometallic compound in the container, and then the gas containing the organometallic compound of predetermined concentration is taken out of the container to vaporize the organometallic compound to a production apparatus for a compound semiconductor.

A cylindrical container made of stainless steel is typically used as the container, and the container having various characteristics in the structure of the bottom, an inlet tube of carrier gas, an outlet tube of the gas or the like has been known for improving thermal efficiency, controllability of concentration of an organometallic compound, usage rate of the organometallic compound in the container and the like. The larger-sized container has been used from the viewpoint of productivity improvement.

In the case where an organometallic compound is solid at normal temperature, the compound is filled into the container in the shape of small grains, or the organometallic compound supported on an inert support obtained by rotating an inert support and a molten organometallic compound is filled into the container.

In the case of being filled an organometallic compound in the shape of small grains into the container, a constant concentration of the organometallic compound in the gas to be vaporized can not be performed, because it is difficult to maintain the contact condition between a carrier gas and an organometallic compound uniform, caused by becoming a smaller grain size by vaporization or accumulating on the bottom of the container to form a flow path for passing the carrier gas.

In the case where an organometallic compound is filled into a container in the shape of being supported by the inert support, the organometallic compound is not supported uniformly and sufficiently, so that a constant concentration of the organometallic compound is not continuously vaporized to occasionally lower usage rate of the organometallic compound in the container.

A method containing a step of filling a supporting material having a porosity of 50 to 80% by volume into a container by 50 to 80% by volume with respect to the container capacity, a step of filling a granular solid material of an organometallic compound into the container, and a step of supporting in the container by melting and rotating the support material and the organometallic compound, has been known as an example of a support method (refer to JP No. 8-299778 A).

However, even this method is not necessarily sufficient, and a method of vaporizing a solid organometallic compound has been desired such that an organometallic compound which is solid at normal temperature can be vaporized at a constant concentration and the usage rate of the organometallic compound can be improved.

SUMMARY OF THE INVENTION

The object of the present invention is to provide a method of vaporizing a solid organometallic compound wherein an organometallic compound which is solid at normal temperature can be vaporized at a constant concentration, the usage rate of the solid organometallic compound in the container can be improved, that is, the remaining amount of the solid organometallic compound in the container is effectively reduced.

Through earnest studies for a method of vaporizing a solid organometallic compound such that an organometallic compound which is solid at normal temperature can be vaporized at a constant concentration, the usage rate of the solid organometallic compound in the container can be improved, the inventors of the present invention have reached the present invention by finding out that pellets of a solid organometallic compound containing an inert support are filled into the container, so that an organometallic compound which is solid at normal temperature can be vaporized at a constant concentration, the usage rate of the solid organometallic compound in the container can be improved.

That is to say, the present invention is a method of vaporizing a solid organometallic compound such that an organometallic compound which is solid at normal temperature, in which the method comprises filling the solid organometallic compound into a container, introducing a carrier gas to the container and taking out the gas containing the organometallic compound, wherein the organometallic compound is in the form of pellets and contains an inert support.

The pellets to be used are previously molded in such a manner that an inert support and a solid organometallic compound are filled into plural recessed portions in the shape of pellets provided on a molding plate and then the solid organometallic compound is hot-melted and thereafter solidified by cooling.

DETAILED DESCRIPTION OF THE PREFERRED EMBODIMENTS

Figure 1:
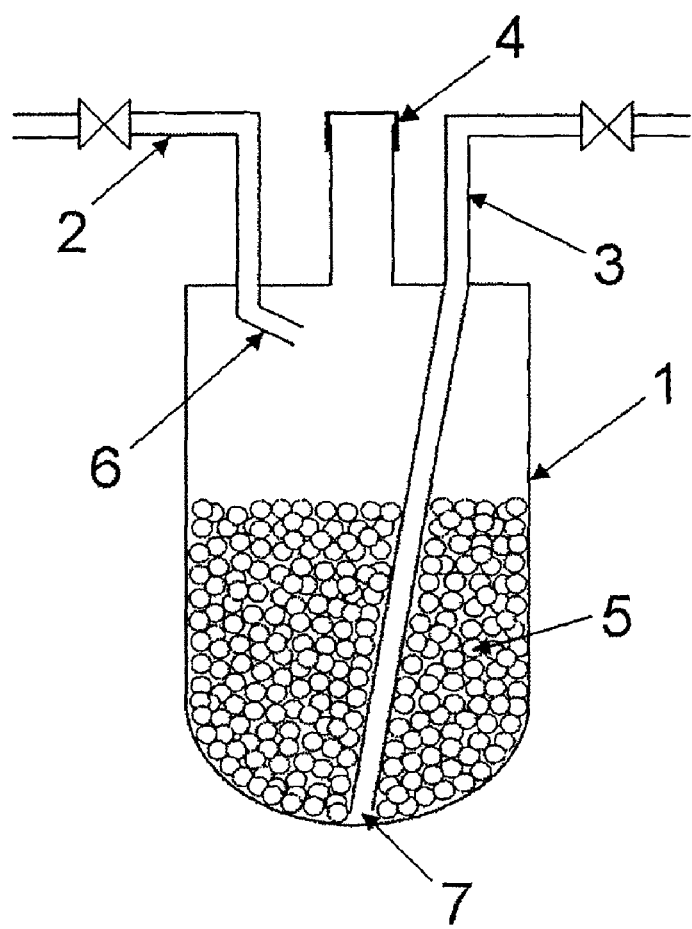
FIG. 1 is a schematic cross-sectional view of an example of a container filled with pellets.

A solid organometallic compound in the present invention is useful, for example, as a raw material for a compound semiconductor by a vapor phase growth method; examples thereof include indium compounds such as trimethylindium, dimethylchloroindium, cyclopentadienylindium, trimethylindium.trimethylarsine adduct and trimethylindium.trimethylphosphine adduct, zinc compounds such as ethylzinc iodide, ethylcyclopentadienylzinc and cyclopentadienylzinc, aluminum compounds such as methyldichloroaluminum, gallium compounds such as methyldichlorogallium, dimethylchlorogallium and dimethylbromogallium, and biscyclopentadienylmagnesium.

Examples of an inert support to be used include ceramics such as alumina, silica, mullite, glassy carbon, graphite, potassium titanate, quartz, silicon nitride, boron nitride and silicon carbide, and metals such as stainless steel, aluminum, nickel and tungsten.

Examples of the shape of the support to be used include, but are not particularly limited to, various shapes such as indeterminate forms, globular shape, fibrous shape, reticular shape, coil shape, cylindrical shape and tubular shape.

Examples of the surface of the support include a smooth surface, a surface with minute irregularities and a surface with many pores (voids) in the carrier itself. Examples of such a support include alumina balls, Raschig ring, heli pack, Dickson packing, stainless steel sintered element and metal wool.

The shape of pellets is not particularly limited but yet examples thereof include spherical shape, hemispherical shape, trapezoidal shape, ellipsoidal shape, cylindrical shape and prismatic shape.

The size of pellets of an organometallic compound containing an inert support is approximately 3 to 20 mm, preferably approximately 5 to 10 mm. This size signifies the maximum length among lengths typifying the shape of pellets, for example, which size signifies the diameter in the case of spherical shape, the major axis in the case of ellipsoidal shape, a longer length among the diameter of the under surface and the height in the case of trapezoidal shape, and a longer length among the diameter of the circle and the length of the column in the case of cylindrical shape.

The pellets are molded in such a manner that an inert support and a solid organometallic compound are filled into plural recessed portions in the shape of pellets provided on a molding plate and then the solid organometallic compound is hot-melted and thereafter solidified by cooling.

An inert support smaller than the shape of pellets are filled into plural recessed portions in the shape of pellets, and subsequently small particles or ground product of a solid organometallic compound are filled thereinto. On this occasion, an inert support may be filled after a solid organometallic compound is filled.

A top cover is disposed on the filled inert support and solid organometallic compound, and fixed by pressing thereagainst. The fixing is performed by a clamp or the like.

A molding plate whose recessed portions are filled with the inert support and solid organometallic compound, and other molding plate whose recessed portions are filled with the solid organometallic compound may be superposed and fixed so that the positions of the recessed portions correspond to each other.

Next, a molding plate in which a top cover is disposed on the filled inert support and solid organometallic compound is put in a container for heating and cooling, which is sealed up.

The filling of the inert support and solid organometallic compound into the recessed portions of a molding plate as well as the sealing of the molding plate into a container for heating and cooling are performed under an inert gas atmosphere such as nitrogen, argon and neon, for example, in a glove box to prevent the solid organometallic compound from contacting with oxygen or moisture.

The oxygen concentration in the atmosphere is approximately 1 ppm (volume) or less, preferably approximately 0.1 ppm (volume) or less, and it is desirable that the oxygen concentration is always monitored by an oximeter. Commercially available products can be used for an oximeter.

It is important that oxygen, moisture and other volatile impurities are sufficiently removed from the inert support, apparatus and tools to be used, and it is desirable that the inert support, apparatus and tools are subject to vacuum degassing while heated at temperatures in a permissible range, and thereafter voids thereof are replaced with inert gas such as nitrogen and argon.

A container for heating and cooling with the molding plate sealed is put in a heating furnace to melt the inside solid organometallic compound by heating. The temperature of the heating furnace is the melting point or higher of the organometallic compound, typically higher than the melting point by approximately 10 to 25° C., preferably approximately 15 to 20° C., which temperature is maintained for approximately 1 to 5 hours, preferably approximately 2 to 3 hours to completely melt the organometallic compound, which is closely adhered to the inert support to form the shape of pellets.

Subsequently, the container for heating and cooling containing the solid organometallic compound put is taken out of the heating furnace and immersed in a cold medium (typically, water is used) to solidify the inside solid organometallic compound by cooling.

Thereafter, the container for heating and cooling containing the solid organometallic compound is put in inert gas atmosphere such as a glove box to take the molding plate out of the container for heating and cooling and take off the top cover, which molding plate is vibrated to take pellets of the solid organometallic compound containing the inert support out of the recessed portions. The obtained pellets of the solid organometallic compound containing the inert support are typically stored in a storage container.

Previously molded pellets of the solid organometallic compound containing the inert support are filled into a container to introduce a carrier gas and take the gas containing the organometallic compound of predetermined concentration out of the container, which gas is supplied.

FIG. 1 shows a schematic cross-sectional view of an example of a container filled with pellets.

A tubular container having the curved bottom is used for a container 1. A carrier gas inlet tube 2 and a carrier gas outlet tube 3 are installed in the upper part of the container 1, and the tip 6 of the carrier gas inlet tube is disposed while inclined by approximately 20 to 50°, preferably approximately 25 to 45°, diagonally downward with respect to the horizontal direction. The tip 7 of the carrier gas outlet tube is disposed at the bottom of the container. Pellets 5 of a solid organometallic compound containing an inert support are filled into the container from a pellet filling opening 4.

The carrier gas inlet tube 2 and the carrier gas outlet tube 3 are installed in the upper part of the container in FIG. 1 but yet may be installed in the side part of the container if the tip 6 of the carrier gas inlet tube is disposed in the upper part of the container and the tip 7 of the carrier gas outlet tube is disposed at the bottom of the container.

The tip 6 of the carrier gas inlet tube is preferably disposed while inclined by approximately 20 to 50° diagonally downward with respect to the horizontal direction and inclined against a side wall of the container from a position away from the central axis of the container.

The filled quantity of the pellets 5 of a solid organometallic compound containing an inert support into the container 1 is typically approximately 50 to 90% by capacity of the container with expectation of the lower part from the tip of the carrier gas inlet tube.

The container having the curved bottom is shown but yet the container is not particularly limited thereto and a conical container is also usable. The container having the curved bottom is preferably used in view of being easily manufactured and being capable of supplying gas at constant concentration and at high efficiency.

A space between the bottom of the container and the tip 7 of the carrier gas outlet tube is approximately 2 to 15 mm, preferably approximately 2 to 10 mm and more preferably approximately 2 to 5 mm. A space of more than approximately 15 mm may deteriorate the usage rate of the organometallic compound.

The container 1 filled with the pellets 5 of a solid organometallic compound containing an inert support is transported to a place to use it, the carrier gas outlet tube 3 is connected to a vapor phase growth device (not shown in the drawing) and the carrier gas inlet tube 2 is connected to a supply source of carrier gas such as hydrogen gas through a flowmeter (not shown in the drawing) or the like.

The container is retained at constant temperature by a temperature-controlled bath to supply a carrier gas of constant flow rate and shift the carrier gas from the upper part to the lower part of the container through a gap between the pellets of a solid organometallic compound, so that the carrier gas containing the organometallic compound of constant concentration at the temperature is supplied to a vapor phase growth device or the like through the carrier gas outlet tube 3.

According to the above-mentioned method of the present invention, an organometallic compound which is solid at normal temperature can be vaporizing at a constant concentration and the remaining amount of the solid organometallic compound in the container is effectively reduced. The method of the present invention is effective also in a large-sized container.

EXAMPLES

The examples of the present invention are described below and the present invention is not limited thereto.

Example 1

Production of Pellets

A molding plate made of polytetrafluoroethylene (PTFE) with an outside diameter of 150 mmf×a thickness of 8 mm having 349 pieces of recessed portions in the trapezoidal shape (top surface (plate surface): 5 mmf, under surface (plate inside): 4 mmf, height: 5 mm) was used to put Dickson packing (3 mmf×3 mm, 0.022 g/piece) in each of the recessed portions, which were next filled uniformly with 0.158 g on average of a ground product obtained by grinding solid trimethylindium (hereinafter, occasionally referred to as TMI). A top cover made of polytetrafluoroethylene (PTFE) with an outside diameter of 144 mmf×a thickness of 3 mm was disposed thereon and put in a heating and cooling container (made of stainless steel), which was sealed up.

Next, the container for heating and cooling was put in a heating furnace to set heating temperature at 106° C. and start heating up. After reaching the preset temperature, the temperature was retained for approximately 2.5 hours to completely melt the TMI, which was made to invade the inside of the Dickson packing and then closely adhere thereto. The container for heating and cooling was taken out of the heating furnace, immersed in water and cooled to room temperature over approximately 2 hours to solidify the inside TMI by cooling.

The molding plate was taken out of the container for heating and cooling to take off the top cover and perform the mold release of the molded TMI pellets from the recessed portions by adding vibration to the molding plate. The obtained TMI pellets were put in a storage container.

The processes except heating and cooling of the container for heating and cooling including the TMI were performed in a glove box replaced with argon gas. The inside of the glove box was repeatedly replaced with vacuum and argon gas to maintain the oxygen density at 1 ppm (capacity) or less and perform the processes while always supplying argon gas.

The apparatuses to be used such as Dickson packing, molding plate, top cover, container for heating and cooling and storage container were subject to vacuum degassing while heated in order to sufficiently remove oxygen and moisture therefrom, and voids thereof were used after replaced with argon.

(Supply of TMI)

103.8 g of the above-mentioned TMI pellets (TMI content: 88.4 g) obtained by molding were put in the same container (outside diameter: 60.5 mm, height: 120 mm, capacity: 230 ml, tilt angle of the tip of carrier gas inlet tube: 500 in the central axis direction) as a container shown in FIG. 1 in the glove box replaced with argon gas.

The container was taken out of the glove box to sequentially connect a hydrogen cylinder and a flow control device to the carrier gas inlet tube side, and sequentially connect a gas densitometer, a cryogenic trap for collecting TMI, a pressure control device and a vacuum pump to the carrier gas outlet tube side.

The container was put in a constant temperature bath and retained at a temperature of 25° C. An epison concentration meter (manufactured by Thomas Swan Scientific Equipment Ltd.) was used as the gas concentration meter.

Figure 2:
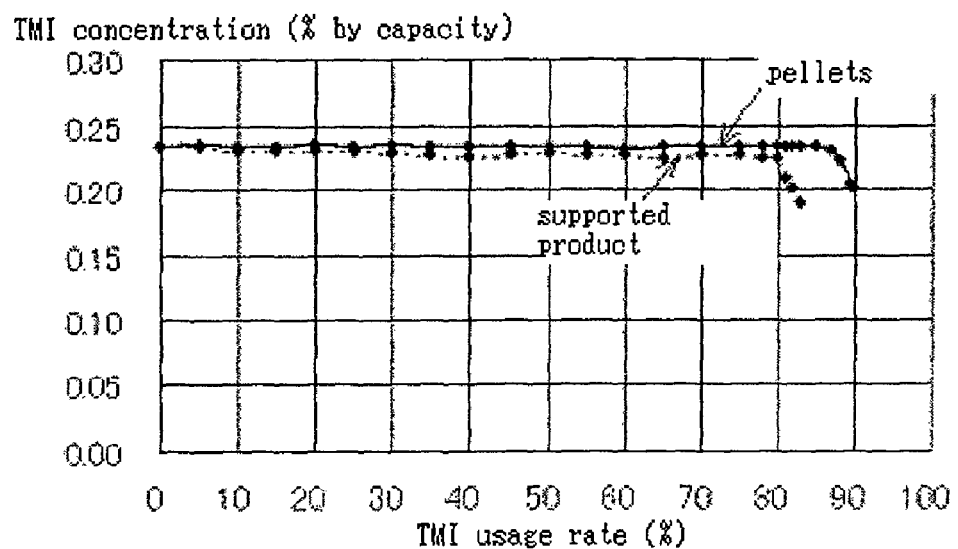
FIG. 2 is a graph showing the results in Example 1 and Comparative Example 1.

Hydrogen gas as a carrier gas was supplied from the hydrogen cylinder at approximately constant 400 ml/minute (in terms of atmospheric pressure) to vaporize the TMI and regularly measure the TMI concentration in the hydrogen gas with the gas concentration meter. The usage rate (%) of the TMI was calculated from the hydrogen gas flow rate and TMI concentration. The results are shown in FIG. 2.

The hydrogen gas can be supplied to a usage rate of approximately 85% at approximately constant 0.234% by capacity without lowering the TMI concentration.

Comparative Example 1

120.2 g of alumina balls of 4 mmf (manufactured by Fujimi Incorporated) as an inert support and 86.1 g of a ground product of TMI were filled into the same container as used in Example 1 in a glove box replaced with argon gas.

This container was leveled in a heated oven and heated to a temperature of 106° C. while rotated. After retaining at this temperature for approximately 2 hours, the heating was stopped to cool the container up to room temperature gradually over approximately 5 hours while rotating in that state, and then solidify and support the TMI on the surface of the alumina balls.

In the container including the TMI supported by these alumina balls, similarly to Example 1, a hydrogen cylinder and a flow control device were sequentially connected to the carrier gas inlet tube side, and a gas densitometer, a cryogenic trap for collecting TMI, a pressure control device and a vacuum pump were sequentially connected to the carrier gas outlet tube side to supply hydrogen gas at approximately constant 400 ml/minute (in terms of atmospheric pressure), vaporize the TMI and regularly measure the TMI concentration in the hydrogen gas with a gas concentration meter. The results are shown in FIG. 2.

The TMI concentration was being lowered little by little and the usage rate was abruptly lowered from approximately 80%.

What is claimed is:

1. A method of vaporizing a solid organometallic compound in which the method comprises:

filling an inert support and the solid organometallic compound into a plural of recessed portions of a shape of pellets and the recessed portions being formed on a molding plate, then hot-melting the solid organometallic compound, thereafter solidifying the solid organometallic compound by cooling to obtain pellets, filling the pellets into a container, introducing a carrier gas to the container, and taking out the gas containing the organometallic compound.

2. The method of vaporizing a solid organometallic compound according to claim 1, wherein a size of the pellets is 3 to 20 mm, represented by a maximum length among lengths typifying a shape of the pellets.

3. The method of vaporizing a solid organometallic compound according to claim 1, wherein the solid organometallic compound is trimethylindium.

* * * * *